United States Patent [19]
Onda et al.

[11] Patent Number: 5,597,743
[45] Date of Patent: Jan. 28, 1997

[54] METHOD OF MANUFACTURING A FIELD EFFECT TRANSISTOR WITH IMPROVED ISOLATION BETWEEN ELECTRODE

[75] Inventors: Kazuhiko Onda; Yoichi Makino, both of Tokyo, Japan

[73] Assignee: NEC Corporation, Tokyo, Japan

[21] Appl. No.: 259,149

[22] Filed: Jun. 13, 1994

Related U.S. Application Data

[63] Continuation of Ser. No. 761,421, Sep. 17, 1991, abandoned.

[30] Foreign Application Priority Data

Sep. 17, 1990 [JP] Japan ..................... 2-246600

[51] Int. Cl.$^6$ .......................... H01L 21/265; H01L 21/44
[52] U.S. Cl. ............................. 437/39; 437/175; 437/912; 437/944
[58] Field of Search ..................................... 257/190, 194, 257/195; 437/39, 175, 176, 912, 944

[56] References Cited

U.S. PATENT DOCUMENTS

| | | | |
|---|---|---|---|
| 4,677,457 | 6/1987 | Wolter | 257/194 |
| 4,916,498 | 4/1990 | Berenz | 257/194 |
| 5,161,235 | 11/1992 | Shur et al. | 257/194 |
| 5,162,877 | 11/1992 | Mori | 257/194 |
| 5,166,083 | 11/1992 | Bayraktaroglu | 257/195 |

*Primary Examiner*—John Niebling
*Assistant Examiner*—Brian K. Dutton
*Attorney, Agent, or Firm*—Laff, Whitesel, Conte & Saret, Ltd.

[57] ABSTRACT

A field effect transistor has (a) a channel layer formed by a non-doped first semiconductor material (b) an electron supply layer formed by a doped second semiconductor material having an electron affinity which is lower than the affinity of the first semiconductor material, and (c) a contact layer formed by a doped third semiconductor material having an electron affinity which is higher than the affinity of the second semiconductor material. These layers are successively formed on a substrate of semi-insulating semiconductor material. Ions are implanted and a surface side portion of the contact layer is removed in a region other than at active portions in order to retain at least a part at a substrate side of the contact layer. By this arrangement, an excellent isolation can be achieved without producing large steps due to the mesa shape. Leakage current is not produced. There is no deterioration of the pinch off characteristic and withstand voltage. Noise characteristics and output efficiencies are excellent. There are no interruptions at electrode forming portions and the yield of fabrication is improved.

7 Claims, 7 Drawing Sheets

5,597,743

METHOD OF MANUFACTURING A FIELD EFFECT TRANSISTOR WITH IMPROVED ISOLATION BETWEEN ELECTRODE

This application is a continuation of application Ser. No. 07/761,421, filed Sep. 17, 1991 now abandoned.

BACKGROUND OF THE INVENTION

1. Field of the Invention

The present invention relates to a structure and a manufacturing method of a field effect transistor in which a channel is made of two dimensional electron gas by the use of compound semiconductors.

2. Description of the Prior Art

The invention relates to a technique for electrically isolating respective devices fabricated on a wafer substrate, or a technique for providing an electric isolation between respective electrode regions of a source, drain, and gate in a semiconductor device. It is important that each of the techniques exerts a remarkable effect on the device characteristics of both IC and discrete devices.

In a field effect transistor using a substrate fabricated by an epitaxial method, a high concentration layer is formed on a semi-insulating semiconductor and a device operation is produced in a part of the layer, specifically, in an operating portion. In a case where isolation between respective electrode regions of source, drain and gate of one device is insufficient, problems arise such as a deterioration of the pinch off characteristic, degradation of the withstand voltage property and the like, due to leakage of operating current.

These problems bring about a deterioration of device characteristics such as noise characteristics, output efficiency, etc. And in the IC, the adjacent devices exert an adverse effect on mutual characteristics to bring about a characteristic deterioration. The most simple and widely used method for causing an electric isolation between respective electrode regions for each of the planar type field effect transistors arranged on a wafer, or electric isolation between respective transistors, is to remove active layer portions between devices. The isolation between devices deteriorates due to an existence of portions of a high concentration layer having charge carriers. Isolation is achieved by removing channel portions of such high concentration through which current can flow.

An example of these isolation methods is carried out by mesa forming and is illustrated in FIG. 1. FIG. 1 shows a semiconductor device with a substrate 1 having an epitaxial chemical deposit GaAs 12 thereon. A non-doped InGaAs layer 13 is above layer 12, a doped AlGaAs layer 14 over it, and a doped GaAs layer 15 on top. The structure is mesa etched at 7 and an ohmic electrode 5 is added around the mesa. A gate electrode 6 is at the top of the semiconductor device.

Another representative method for causing isolation is ion implantation. For example, ions of boron or oxygen are implanted with a certain energy into a carrier layer in which electrons or holes exist to prevent free electron from moving by a capture of electrons and a destruction of crystallinity. This method can achieve an isolation without forming steps which are produced upon mesa forming by etching. Therefore, this method contributes remarkably to an improvement of the yield rate for manufacturing integrated circuits, etc.

There are disadvantages in the isolation process using mesa etching. First, there arises a problems with respect to a selection of an etching rate for each layer of an epitaxial growth substrate of a hetero junction system. Generally, it is usual that the etching rates of respective layers are different according to the difference of material compositions. In particular, the etching rates are different according to pH values of etchants to be used. When there is a layer of a rapid etching rate on the lower side of the upper layer, there is a phenomenon in which the upper layer is scooped by the lower layer. Therefore, when isolation is produced by mesa forming, larger steps are produced at the mesa edges.

FIGS. 2 and 3 illustrate an example of the step, respectively. Reference numeral 21 generally indicates any suitable substrate having successive layers on it in order to illustrate how a step portion 16 may be formed during a mesa etch. When a mixture of acid and hydrogen peroxide solution is used as etchant, the etching rates of GaAs, AlGaAs and InGaAs are different from each other and become higher in this order. Therefore, when a semiconductor layer of two layers of GaAs and AlGaAs is etched, the AlGaAs layer 22 under the GaAs layer 23 is deeply penetrated by side etching, as shown in FIG. 2, to produce a large step portion 16. Layer 24 may be a InGasAs layer which is here presented to show the possible effect of a mesa etching upon two layers. In 2DEGFET of a psendomorphic series for example, a GaAs/InGaAs/AlGaAs series, a larger step portion 16 is produced at a hetero junction as shown in FIG. 3.

When the thickness of an active layer on a substrate is large, the total extent of etching becomes larger, a problem arises because the steps at the mesa edges are made larger. An interruption of the electrode may be produced by the step at the mesa side, as described above, at the portion over which a part of the gate electrode extends upon forming a gate electrode. This contributes to the deterioration of the FET characteristics and the yield rate. Such an interruption of the electrode is produced, when not only a gate electrode but also an ohmic electrode is formed to extend over a mesa portion and a portions other than the mesa.

Upon isolation by ion implantation, it is difficult to set the condition of ion implantation which is available for sufficient isolation in a channel of high concentration. It is necessary to set an energy value and a dosage. In connection with the diffusion of ions in which consideration is paid to the ability of prevention of the wafer to be implanted, the total ion density on the surface side of the substrate inevitably becomes low. This means that when the implantation energy of ion to be implanted is made low, the ion diffusion is prevented on the surface side of the substrate. On the contrary, the condition on the device side becomes difficult, and the stability condition of the ion beam may fall down.

SUMMARY OF THE INVENTION

It is an object of the present invention to provide an FET in which isolation between respective electrodes such as a source, drain, gate and the like can be sufficiently achieved, and there is no interruption in respective electrodes.

The present invention provides a field effect transistor comprising at least a construction in which a channel layer consisting of a non-doped first semiconductor, an electron supply layer consisting of a doped second semiconductor of which electron affinity is lower than that of said channel layer. A contact layer consists of a doped third semiconductor material having an electron affinity which is higher than the affinity of the electron supply layers. These layers are successively laminated on a substrate of a semi-insulating semiconductor material, characterized in that ions are implanted into regions other than an active portion of the field effect transistor. A surface portion of said contact layer is removed except for at least a part on a substrate side thereof in the regions other than the active portion.

The present invention provides a method for manufacturing a field effect transistor, characterized by the steps of: growing a channel layer consisting of at least a non-doped first semi-conductor material, an electron supply layer consisting of a doped second semiconductor having an electron affinity which is lower than the affinity of the channel layer. A contact layer consisting of a doped third semiconductor has an electron affinity which is higher than the affinity of the electron supply layer. Isolation is achieved by successive lamination of layers on a substrate of a semi-insulating semiconductor, by implanting ion into regions other than an active portion of the field effect transistor, and by removing a surface side portion of the contact layer except for at least a part on a substrate side thereof in said regions other than the active portion.

The present invention provides another field effect transistor comprising at least a construction in which a buffer layer consisting of a non-doped first semiconductor, a channel layer consisting of a non-doped second semiconductor with an electron affinity which is higher than the affinity of said buffer layer, an electron supply layer consisting of a doped third semiconductor with an electron affinity which is lower than the affinity of said channel layer, and a contact layer consisting of a doped fourth semiconductor with an electron affinity which is higher than the affinity of said electron supply layer. These layers are successively laminated on a substrate of a semi-insulating semiconductor. The ions are implanted into regions other than an active portion of said field effect transistor. A surface side portion of said contact layer is removed except for at least a part on a substrate side thereof in said regions other than said active portion.

The present invention provides a method for manufacturing said field effect transister, characterized by the steps of growing a buffer layer consisting of at least a non-doped first semiconductor, a channel layer consisting of a non-doped second semiconductor with an electron affinity which is higher than the affinity of said buffer layer, an electron supply layer consisting of a doped third semiconductor with an electron affinity which is lower than the affinity of said channel layer, and a contact layer consisting of a doped fourth semiconductor with an electron affinity which is higher than the affinity of said electron supply layer. The layers are successive by lamination on a substrate of a semi-insulating semiconductor. Ions are implanted into regions other than an active portion of said field effect transistor. A portion of a surface side portion of said contact layer is removed, except for at least a part on a substrate side thereof in said regions other than said active portion.

Generally, the distribution of implantation density produced by ion implantation into a semiconductor has a profile which is low on the surface side of the substrate, has a peak value at a position of a certain depth, and then goes down. Therefore, when a high concentration layer is formed on the surface side of the substrate, the isolation between respective elements inevitably becomes insufficient. According to the present invention, the insufficient isolation is overcome by removing the high concentration portions by means of etching. Generally in the construction of the 2DEGFET, it is necessary to improve its characteristics by providing a contact layer of high concentration on the uppermost layer in order to decrease source resistance. According to the present invention in the structure of the 2DEGFET, the need for formation of steps due to difference of etching rates is avoided by using an etching operation wherein the portion to be etched may not extend over the hetero junction area but may be limited to a single layer of a contact layer positioned at the uppermost layer. Therefore, there is no interruption of electrodes at the mesa edge. Hence, the problems are resolved with regard to a deterioration of characteristics of FET and a reduction of yield during fabrication.

DESCRIPTION OF THE PREFERRED EMBODIMENTS

A first embodiment of the present invention will now be described in detail with reference to the drawings.

Figure 4:
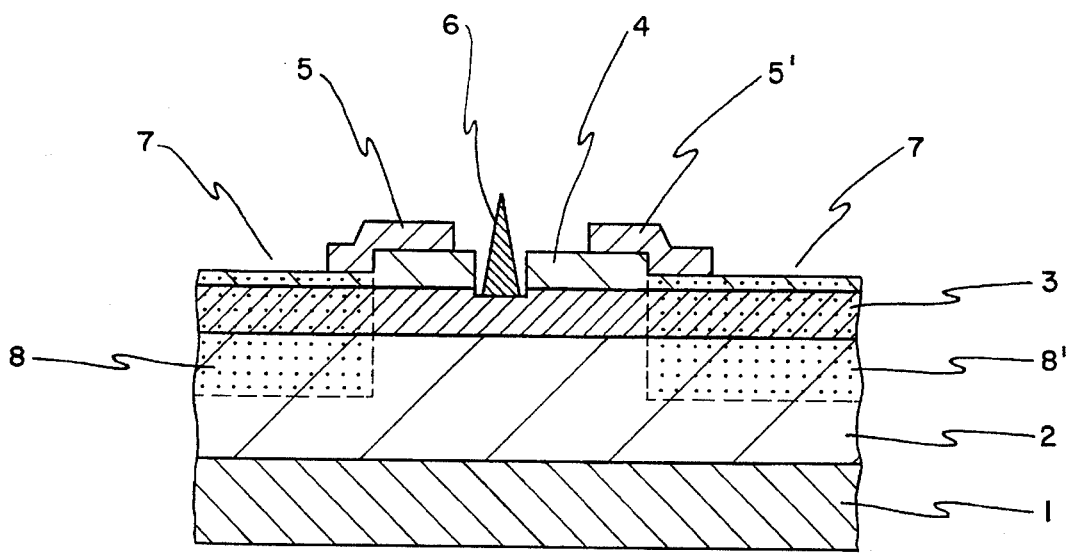
FIG. 4 is a sectional view of a field effect transistor according to a first embodiment of the present invention.

FIG. 4 shows a structure of a field effect transistor manufactured according to the present invention. In order to achieve isolation between respective field effect transistors arranged on a wafer, ion implantation is executed into regions other than active portions of the device, and etching is then carried out on the surface side of the upper most layer of high concentration of the above-mentioned regions. A sufficient isolation is achieved by ion implantation on the substrate side of the upper most layer of high concentration.

FIG. 4 shows 2DEGFET of which upper-most layer is an n type GaAs layer 4 (source and drain regions and source, drain and gate electrodes are shown in FIG. 4).

Figure 5A:
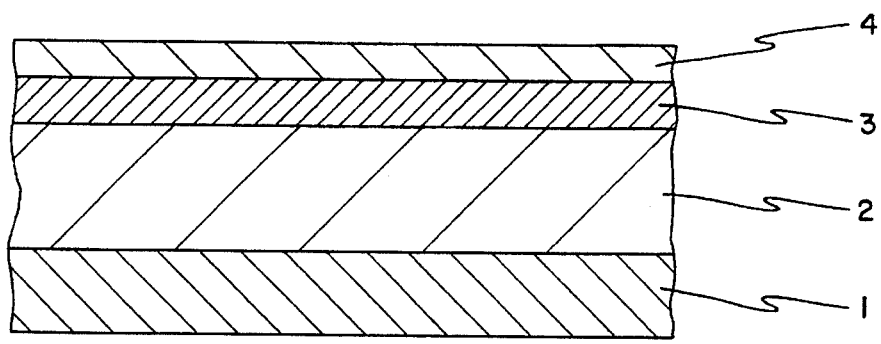
FIGS. 5(a) to (e) shows processes of fabrication of a field effect transister according to the first embodiment.

Then, a manufacturing process of such a field effect transistor is described with reference to FIGS. 5a–5e. As shown in FIG. 5(a), layers are successively grown on a semi-insulating (S.I.) GaAs substrate 1 by, for example, a molecular beam epitaxial growth method, chemical deposition method of organic metals or the like. The respective layers are composed of a non-doped GaAs channel layer 2 of 500 nm, a doped AlGaAs electron supply layer 3 of 30 nm which is doped with $2\times10^{18}$ cm$^{-3}$ to an n-type, and a doped GaAs contact layer 4 of 50 nm which is doped with $3\times10^{18}$ cm$^{-3}$ to an n-type.

Figure 5B:
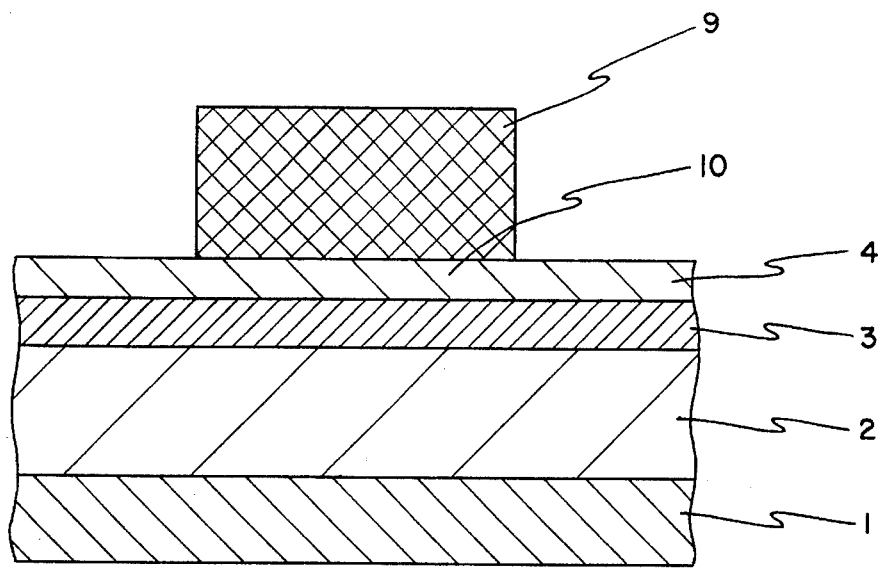
Figure 5C:
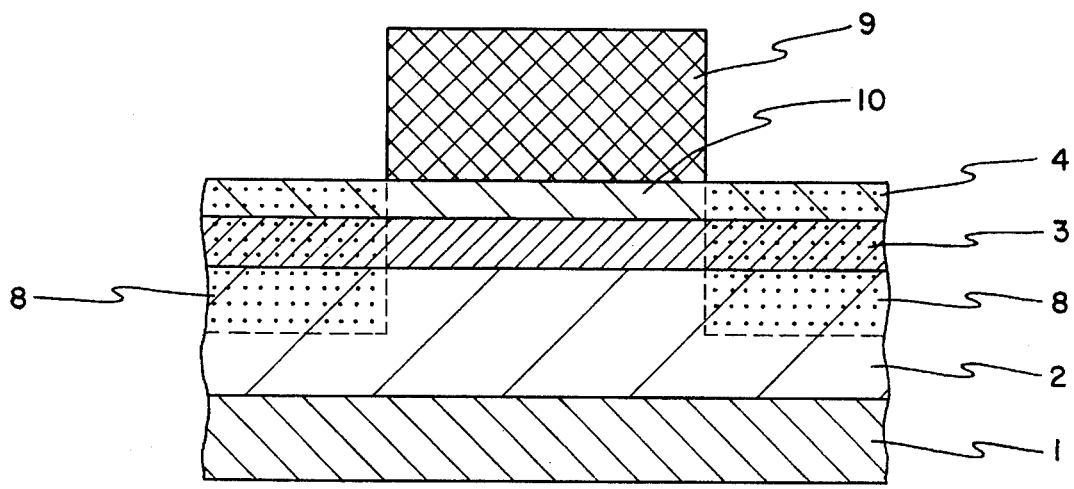

As shown in FIG. 5(b), an active layer portion 10 of the field effect transistor is masked on the substrate by the use of, for example, photo resist 9, etc. Then, as shown in FIG. 5(c), an ion implantation 8 is executed by the use of, for example, boron ion 11. It is necessary to suitably change the implantation energy and doses of ions according to a substrate structure. It is assumed here that, for example, the implantation energy is 40 KeV and the doses are $1\times10^{14}$ cm$^{-3}$. Thus, a boron ion is sufficiently implanted into the doped AlGaAs layer 3 and the non-doped GaAs layer 2 to be isolated.

Figure 5D:
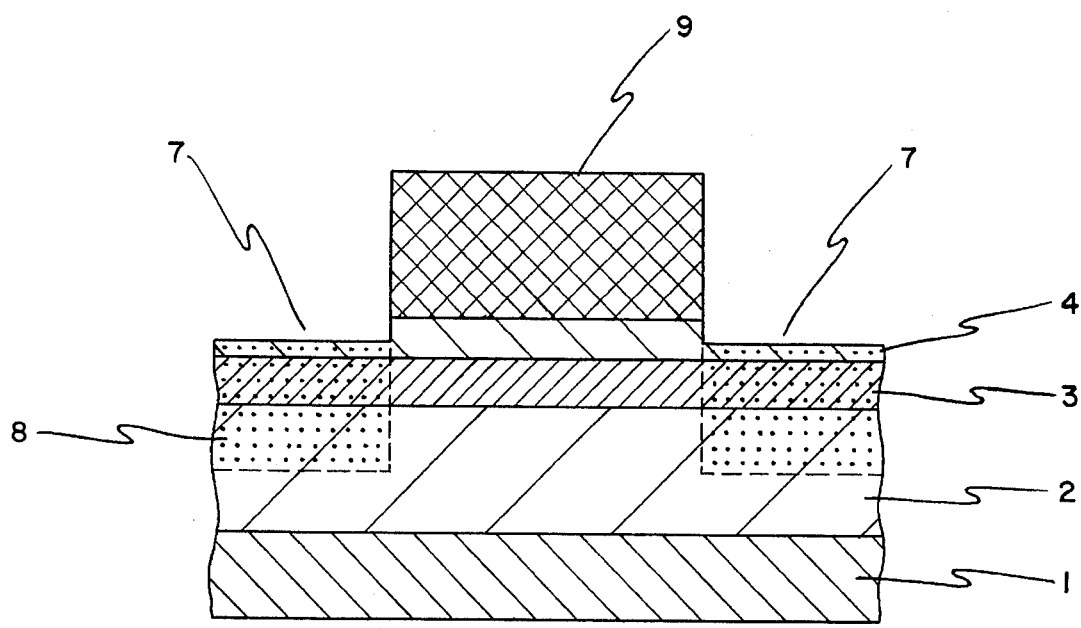

In the uppermost doped GaAs layer 4, an ion is insufficiently implanted on the surface side thereof, so that a leakage current is prone to flow along the surface layer. Therefore, as shown in FIG. 5(d), the next process involves removing by etching to the depth of about 40 nm on the surface side of the doped GaAs layer 4 with etchant composed of the mixture of phosphoric acid, hydrogen peroxide solution and water, for example. By the use of the mask of photo resist, a mesa etched portion 7 is formed. The regions are completely isolated each other except for the active portion 10 by this process.

It was necessary to remove completely by etching at least a part of the doped GaAs layer 4, the doped AlGaAs layer 3, and the non-doped GaAs layer 2 in the conventional mesa forming method, resulting in the etching depth of 100 nm in this structure. The depth to be etched in this embodiment is not more than half of the depth used in the conventional example.

Figure 5E:
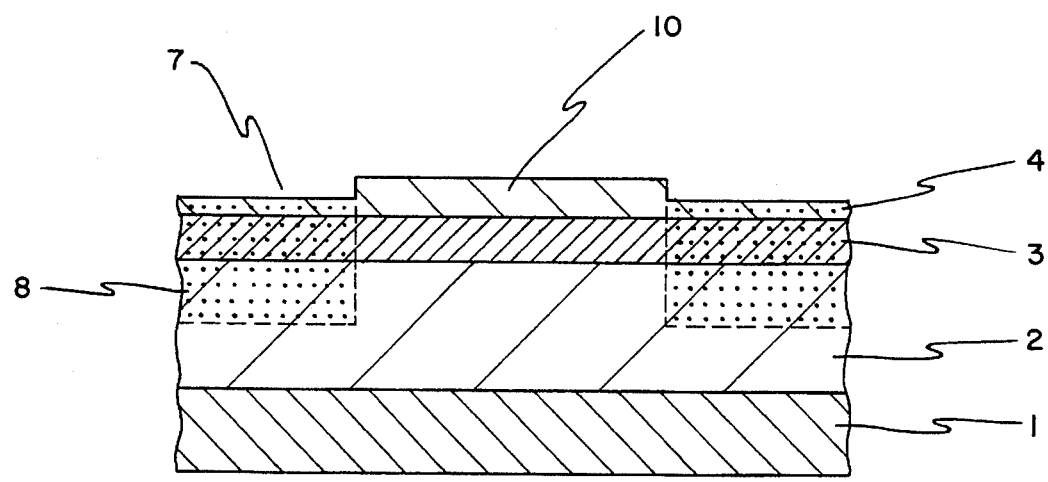

Thus, the isolation process of the field effect transistor of the present invention is completed, so that the structure as shown in FIG. 5(e) can be obtained. Then, after the processes of formation of an ohmic electrode 5 and a gate electrode 6, and so on, the field effect transistor shown in FIG. 4 is produced. The processes of electrode formation can be easily carried out by the use of the general method, for example, an evaporation lifting off method, etc.

As explained in the foregoing, the field effect transistor of the embodiment is completed. However, the structure of the semiconductor is not limited to that of the above embodiment, The semiconductor may have another structure. For example, a spacer layer which contains no impurity may be inserted between the electron supply layer and the channel layer. Or, the buffer layer having electron affinity which is lower than the affinity of the channel layer may be inserted into the channel layer. Or a non-doped layer or a doped layer of low concentration may be inserted between the contact layer and the electron supply layer. Thus the present invention can be applied to various type of FETs. As to material, the present invention can be applied not only to AlGaAs/GaAs series but also to other III–V series compound semiconductors.

According to this embodiment, isolation can be also executed for a substrate structure having the uppermost layer of high concentration (contact layer) without producing a large step due to a mesa etching. Therefore, a field effect transistor having good characteristics is obtained without producing interruptions at the step of the gate electrode. By a manufacturing method according to the embodiment, FETs which are excellent in the characteristics of the pinch off and the withstand voltage can be easily produced with a high yield. An implantation process can be easily carried out without requiring precise control.

The isolation technique according to the present invention is effective for providing an electric isolation for separate independent elements, for example, upon fabrication of an integrated circuit such as an MMIC and the like.

Though the embodiment of the present invention has been described in reference to specific materials and specific values, the present invention is not limited to such conditions and material. For example, although the mixture of phosphoric acid, hydrogen peroxide solution and water has been used as an etchant in the etching process in the embodiment, the etchant is not limited to this mixture. It is possible to use various etchants such as a mixture of sulfuric acid, hydrogen peroxide solution and water, mixture of citric acid, hydrogen peroxide solution and water, or the like. Or reactive etching may be carried out by the use of mixing gas containing a halogen gas, as a main component. An energy condition and a dose are not limited to the conditions of the embodiment. Those conditions are required to be suitably changed according to the substrate structure. Also, the depth to be etched may be suitably changed according to the substrate structure and the ion implantation condition. The kinds of ions to be implanted are not fundamentally limited. Any ion capable of isolation can be used with no problem, even if it is an ion other than the boron ion, for example, an oxygen ion.

Figure 6:
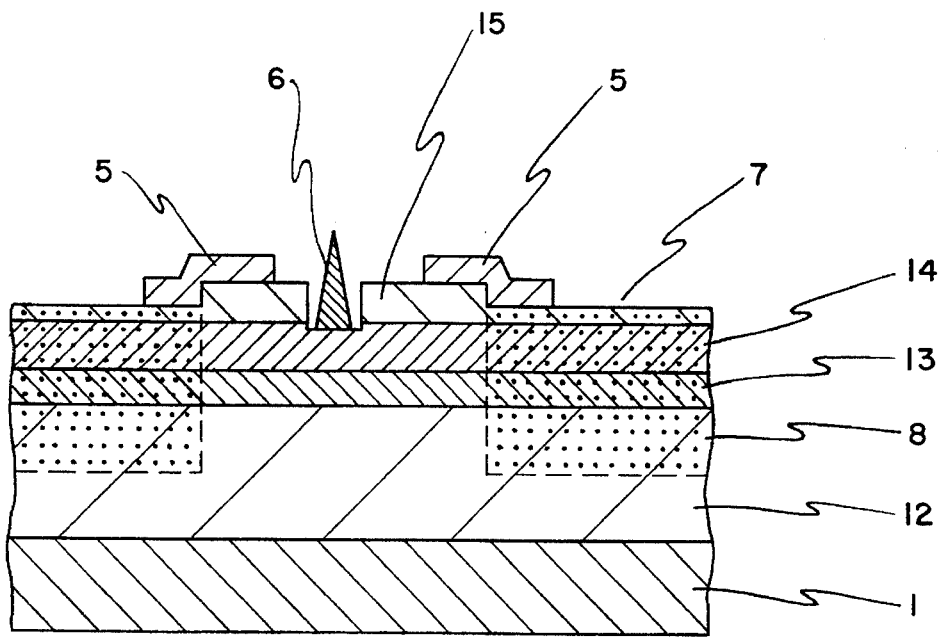
FIG. 6 is a sectional view of a field effect transister according to a second embodiment of the present invention.

A second embodiment of the present invention will now be described in detail with reference to the drawings. FIG. 6 shows a structure of a field effect transistor fabricated according to the present invention. In order to achieve an isolation of separate field effect transistors arranged on a wafer, an ion implantation is executed into regions other than the active portion of each device, and etching is performed on the surface side of the uppermost layer of high concentration on each implanted region. A sufficient isolation is achieved by ion plantation on the substrate side of the upper most layer of high concentration. FIG. 6 shows a 2DEGFET of which the uppermost layer is a GaAs layer of high concentration.

Figure 7A:
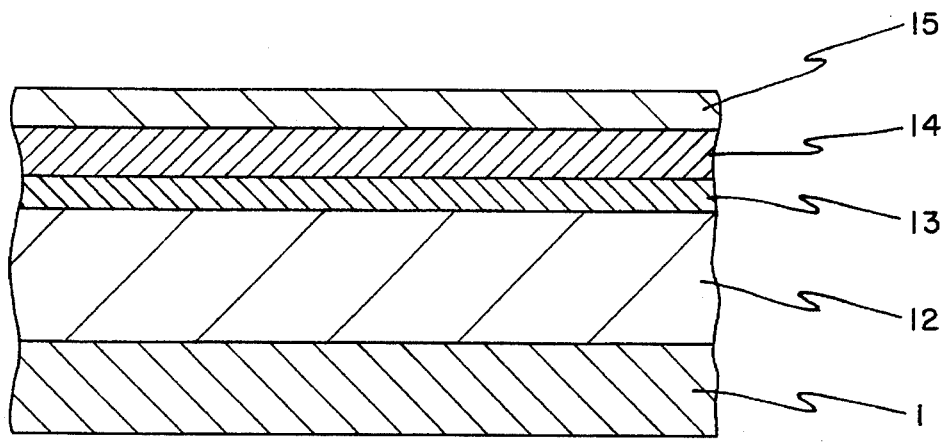
FIGS. 7(a) to (e) shows processes of fabrication of a field effect transister according to the second embodiment.

Next, an example of a method for fabricating such a field effect transistor will be described with reference to production drawings in FIG. 7. As shown in FIG. 7(a), layers are successively grown on a semi-insulating GaAs substrate 1 by, for example, a molecular beam epitaxial growth method, a chemical deposition method of organic metals or the like, respective layers composed of a non-doped GaAs layer 12 of 500 nm, a non-doped InGaAs layer 13 of 15 nm, a doped AlGaAs layer 14 of 30 nm which is doped with $2\times10^{18}$ cm$^{-3}$, and a doped GaAs layer 15 of 50 nm which is doped with $3\times10^{18}$ cm$^{-3}$.

Figure 7B:
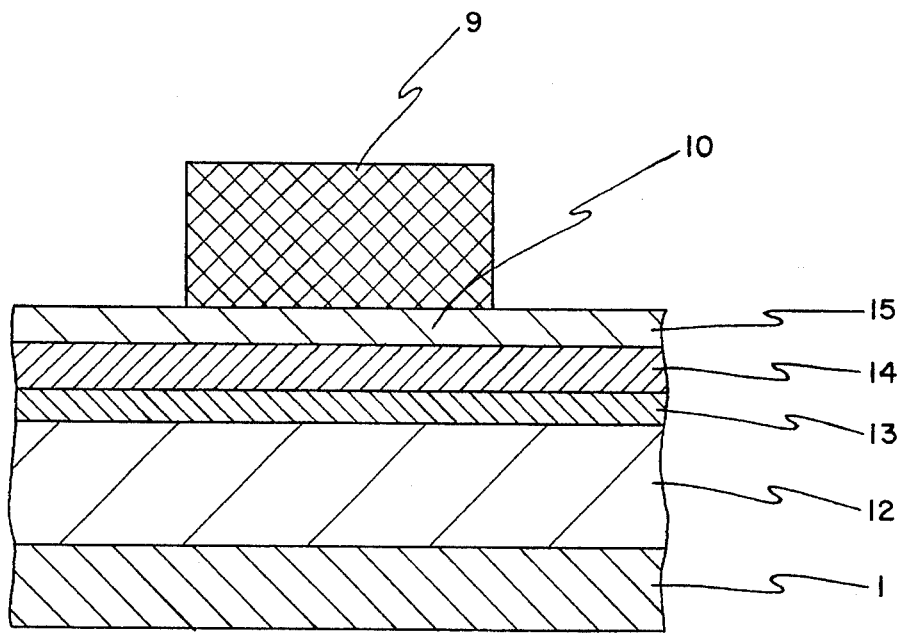
Figure 7C:
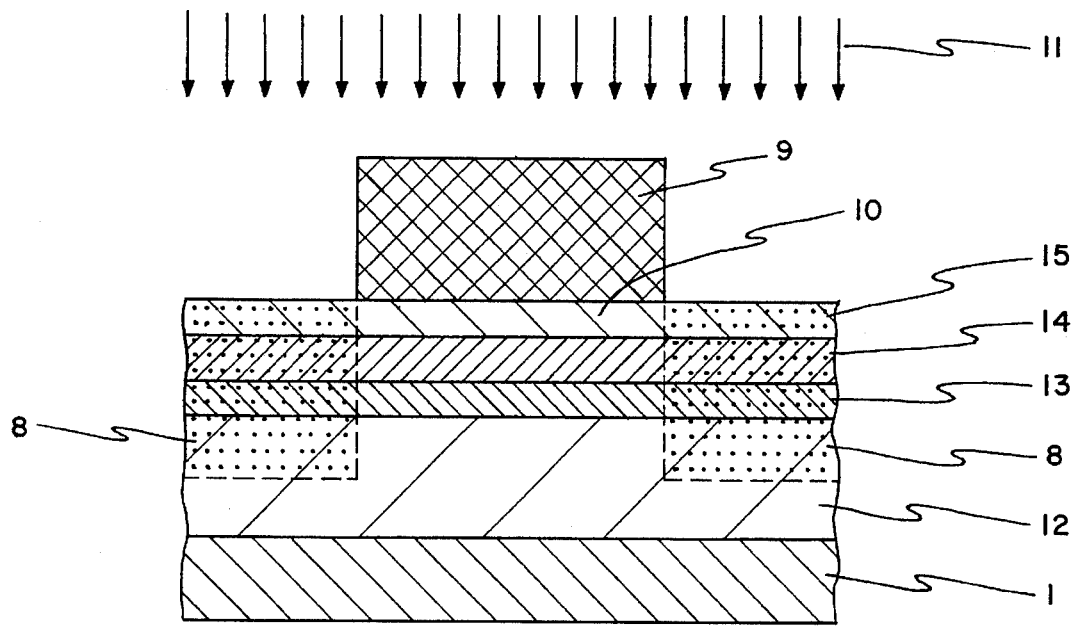

As shown in FIG. 7(b), an active layer portion 10 of the field effect transistor is masked on the substrate by the use of, for example, photo resist 9, etc. Then, as shown in FIG. 7(c), an ion implantation is executed by the use of, for example, boron ion 11. It is necessary to suitably change implantation energy and a dose of ion according to a substrate structure. It is assumed here that, for example, the implantation energy is 40 KeV and the dose is $1\times10^{14}$ cm$^{-3}$. Thus, a boron ion is sufficiently implanted into the doped AlGaAs layer 14, the non-doped InGaAs layer 13 and the non-doped GaAs layer 12 to be isolated. In the uppermost doped GaAs layer 15, an ion is insufficiently implanted on the surface side thereof, so that leakage current is prone to flow along the surface layer.

Therefore, the next process involves removing by etching to the depth of about 40 nm on the surface side of the doped GaAs layer 15 with an etchant composed of the mixture of phosphoric acid, hydrogen peroxide solution and water, for example, by the use of the mask of photo resist 9.

Figure 1:
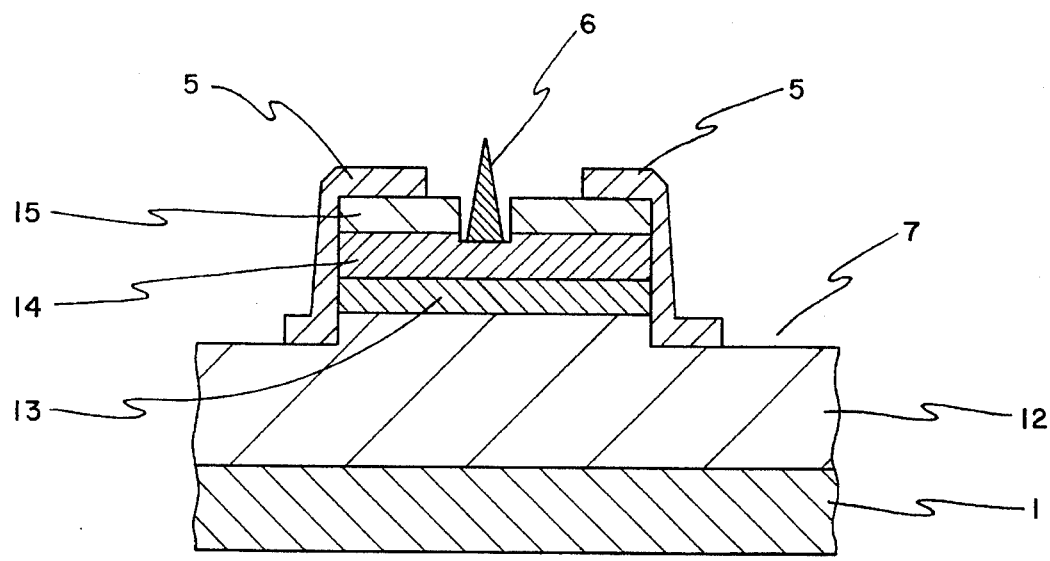
FIG. 1 is a sectional view of a conventional field effect transistor.
Figure 2:
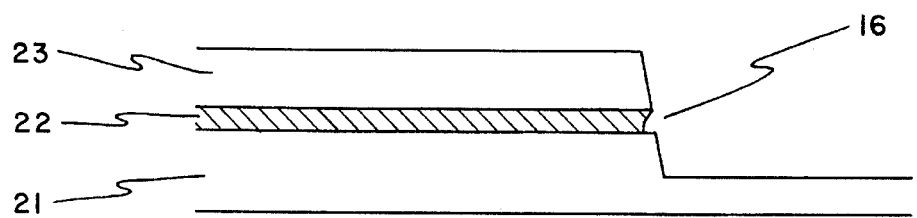
FIGS. 2 and 3 show sectional views for explaining the step by mesa etching, respectively for the conventional field effect transistor.
Figure 3:
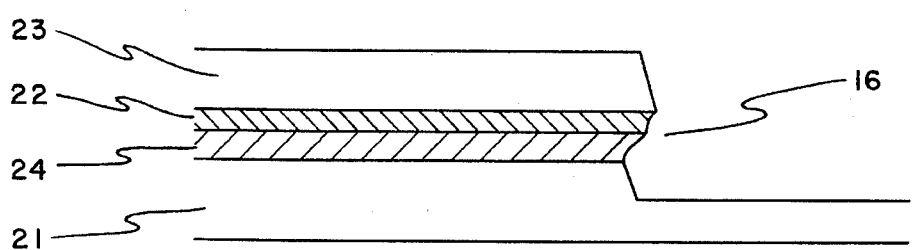
Figure 7D:
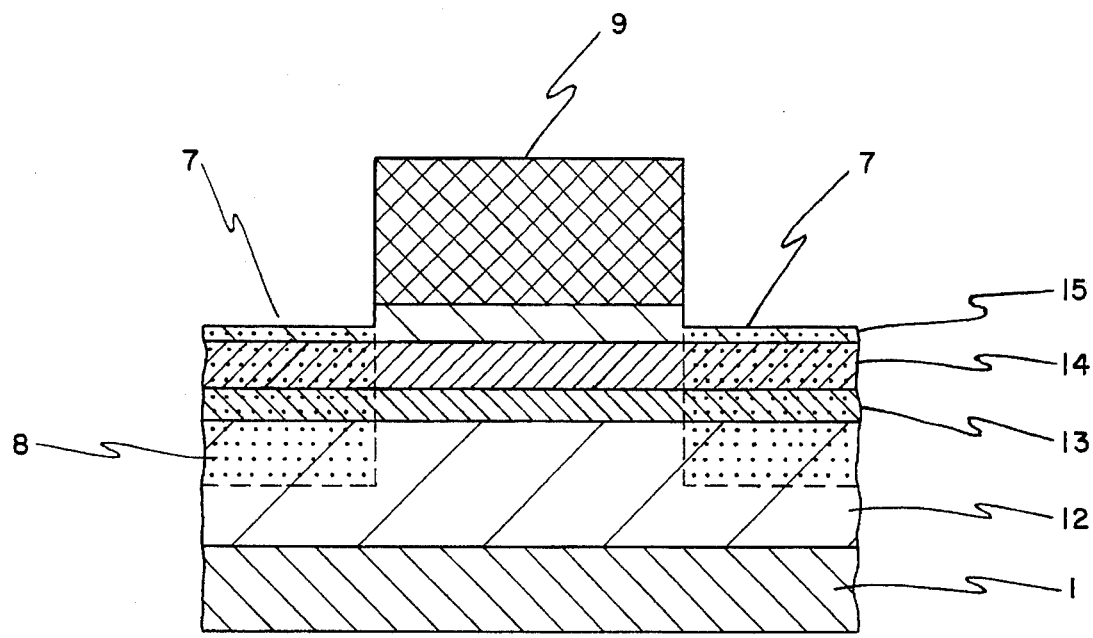

As shown in FIG. 7(d), the regions are completely isolated from each other except for the active portion 10 by this process. It was necessary to remove completely by etching at least a part of the doped GaAs layer 15, the doped AlGaAs layer 14, InGaAs layer 13 and the non-doped GaAs layer 12 in the conventional complete mesa forming method, resulting in the etching depth of at least 100 nm in this structure as shown in FIG. 1. However, the depth to be etched in this embodiment may be not more than half of 100 nm.

Figure 7E:
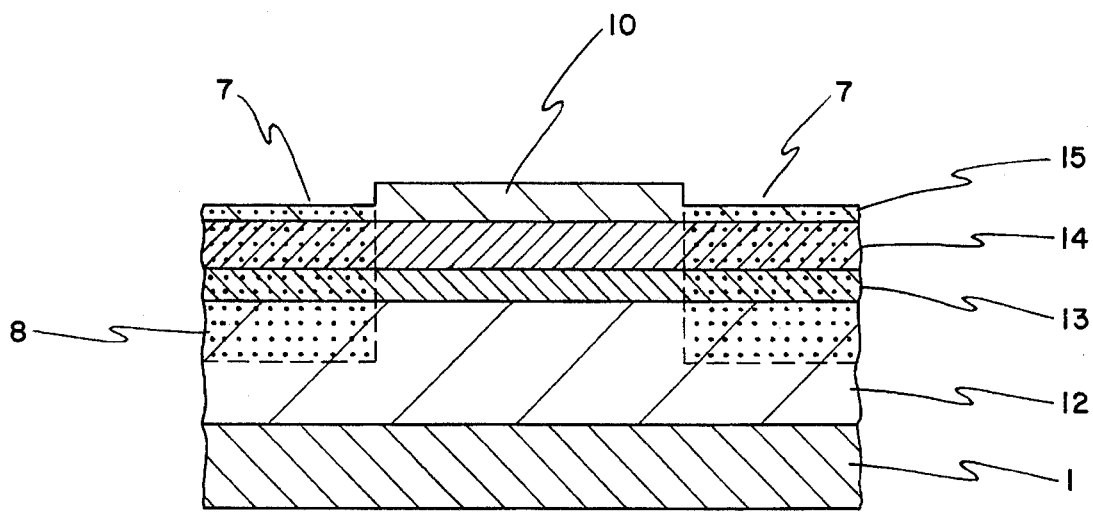

Thus, as shown in FIG. 7(e) the isolation process of the field effect transistor of the present invention is completed. Then, after the process of formation of an ohmic electrode and a gate electrode, and so on, the field effect transistor shown in FIG. 6 is finished.

According to the embodiment, the isolation can be executed without producing large steps at the mesa shaped portion. Also, there is no interruption to the laminated structure having a different composition such as especially a pseudomorphic 2DEGFET having a distortion layer of InGaAs or the like. This, a field effect transistor having excellent characteristics can be obtained without producing an interruption at the step portion of the gate electrode. The transistor can be easily fabricated with a good yield by the manufacturing method according to the embodiment.

Needless to say, the isolation technique according to the present invention is effective for performing electric isolation of independent separate devices even when fabricating an integrated circuit such as MMIC, etc., for example.

Like the first embodiment, this embodiment was described in regard to special material and special values. This was for the purpose of giving a better appreciation of the present invention. The conditions and materials illustrated in this embodiment are not so limited.

Also in this embodiment, various modifications can be made as to the semiconductor layers. For example, a non-doped spacer layer may be inserted between the electron supply layer and the channel layer. A semiconductor layer having an electron affinity which is lower than the affinity of the buffer layer may be inserted into the buffer layer. Or a non-doped layer or a doped layer of a low concentration may be inserted between the contact layer and the electron supply layer. The material series can be applied to an InGaAs/InGaAsP/InP series without being limited to an InGaAs/AlGaAs/GaAs series.

According to the present invention, a 2DEGFET, etc., and an FET having a contact layer of high concentration, may be given an excellent isolation without producing large steps due to the mesa shape. Leak currents does not produce, and deterioration of the pinch off characteristic and withstand voltage do not occur. Therefore, devices can be obtained which are excellent in noise characteristics and output efficiencies. There are no interruptions at electrode forming portions and yield of fabrication can be improved.

We claim:

1. A method for manufacturing a field effect transistor comprising steps of:

forming at least a channel layer comprising a non-doped first semiconductor layer having a first electron affinity, an electron supply layer comprising a doped second semiconductor layer having a second electron affinity which is lower than the first electron affinity of said first semiconductor layer, and a contact layer comprising a doped third semiconductor material having a third electron affinity which is higher than the second electron affinity of said second semiconductor material, said first, second and third semiconductor layers being formed in a sequence of steps corresponding to an order in which the first, second, and third layers are mentioned above, said first, second, and third layers are being formed on a semi-insulating semiconductor material, said contact layer having a first portion and a second portion surrounding said first portion;

covering said first portion of said contact layer with a mask layer;

implanting ions into a surface of said second portion of said contact layer by using said mask layer as a mask, said ions being implanted into said second portion of said contact layer and into portions of said channel layer and electron supply layer; and selectively removing a surface part of said second portion of said contact layer that is not covered by said mask, thereby leaving a remaining part thereof.

2. The method for manufacturing a field effect transistor according to claim 1, wherein the step of forming the channel layer includes forming a buffer layer between said channel layer and said substrate, said buffer layer being formed by a non-doped fourth semiconductor material having an electron affinity which is lower than the affinity of said first semiconductor material.

3. A method of manufacturing a field effect transistor comprising the steps of:

forming at least a channel layer comprising a non-doped first semiconductor material having a first electron affinity;

forming an electron supply layer on a surface of said first semiconductor material, said electron supply layer comprising a doped second semiconductor material on a surface of said first semiconductor material, having a second electron affinity which is lower than the first electron affinity of said first semiconductor material;

forming a contact layer on a surface of said electron supply layer, said contact layer comprising a doped third semiconductor material having a third electron affinity which is higher than the second electron affinity of said second semiconductor material, said first, second and third semiconductor layers being formed on a semi-insulating substrate of semiconductor material in an order where the channel layer is formed first, the electron supply layer is formed second and the contact layer is formed third;

covering a first portion of said contact layer with a mask layer, a second portion of said contact layer being free of said mask layer;

implanting ions into a surface of a second portion of said contact layer, said mask layer preventing an implantation of said ions in said first portion of said contact layer, said ions being implanted into a depth extending through said contact layer and said electron supply layer and further into a portion of said channel layer; and selectively removing a surface part and leaving a remaining part of said second portion of said contact layer.

4. A method of manufacturing a field effect transistor comprising the steps of:

forming at least a channel layer comprising a non-doped first semiconductor material having a first electron affinity;

forming a non-doped buffer layer of semiconductor material over a surface of said channel, said buffer layer having an electron affinity which is lower than said first electron affinity;

forming an electron supply layer on a surface of said buffer layer, said electron supply layer comprising a doped second semiconductor material having a second electron affinity which is lower than the first electron affinity of said first semiconductor material, and forming an active layer on a surface on said electron supply layer, said active layer comprising a doped third semiconductor material having a third electron affinity which is higher than the second electron affinity of said second semiconductor material; said channel, buffer, electron supply, and active layers being successively formed in a sequential order on a semi-insulating semiconductor material;

covering a first portion of said active layer with a mask layer leaving a second portion of said contact layer uncovered by said mask layer;

implanting ions in said active layer in a surface of said second portion, said mask layer preventing an implanting of said ions into said first portion of said active layer, said ions being implanted to a depth extending through said active, electron supply, and buffer layers and continuing into a portion of said channel layer; and selectively removing a surface part of a second portion of said active layer that is not covered by said mask layer, thereby leaving a remaining part under said second portion.

5. The method of either claim 3 or claim 4 wherein said selective removal step is a removal of a portion of an uppermost layer where said step of implanting said ions is insufficient to prevent a leakage current therethrough.

6. The method of claim 5 wherein said portion of said uppermost layer that is removed has a depth of about 40 nm.

7. The method of claim 5 wherein said removal of said portion of said upper most layer is by etching with a mixture of phosphoric acid, hydrogen peroxide, and water.

\* \* \* \* \*